(12) United States Patent
Shaheen et al.

(10) Patent No.: US 6,812,399 B2
(45) Date of Patent: Nov. 2, 2004

(54) PHOTOVOLTAIC CELL

(75) Inventors: Sean Shaheen, Cave Creek, AZ (US); Christoph Brabec, Linz (AT); Thomas Fromherz, Rottenegg (AT); Franz Padinger, St. Florian (AT); Sedar Sariciftci, Linz (AT); Erhard Gloetzl, Linz (AT)

(73) Assignee: QSEL-Quantum Solar Energy Linz Forschungs-Und Entwick-Lungs-Gesellsch (AT)

( * ) Notice: Subject to any disclaimer, the term of this patent is extended or adjusted under 35 U.S.C. 154(b) by 0 days.

(21) Appl. No.: 10/258,709

(22) PCT Filed: Apr. 27, 2001

(86) PCT No.: PCT/AT01/00128
§ 371 (c)(1),
(2), (4) Date: Feb. 27, 2003

(87) PCT Pub. No.: WO01/84644
PCT Pub. Date: Nov. 8, 2001

(65) Prior Publication Data
US 2003/0159729 A1 Aug. 28, 2003

(30) Foreign Application Priority Data
Apr. 27, 2000 (AT) .......................................... A 735/2000

(51) Int. Cl.⁷ ............................................... H01L 51/20
(52) U.S. Cl. ...................... 136/263; 136/256; 136/252; 429/111; 257/40
(58) Field of Search ............................... 136/263, 256, 136/252; 429/111; 257/40

(56) References Cited

U.S. PATENT DOCUMENTS

| | | | |
|---|---|---|---|
| 5,006,915 A | * | 4/1991 | Yoshikawa et al. ........... 257/40 |
| 5,009,958 A | | 4/1991 | Yamashita et al. |
| 5,171,373 A | | 12/1992 | Hebard et al. |
| 5,178,980 A | | 1/1993 | Mort et al. |
| 5,185,208 A | | 2/1993 | Yamashita et al. |

(List continued on next page.)

FOREIGN PATENT DOCUMENTS

| | | |
|---|---|---|
| JP | 60 149 177 | 8/1985 |
| WO | WO94/05045 | 3/1994 |
| WO | WO 99/49525 | 9/1999 |
| WO | WO 01/84645 A1 | * 11/2001 |
| WO | WO 01/86734 A1 | * 11/2001 |

OTHER PUBLICATIONS

Brabec et al, "Interpenetrating networks of fullerens and conjugated polymers for plastic photovoltaics," 6th European Photovoltaic Solar Energy Conference, pp. 39–42, May 1–6, 2000.*

Brabec et al, "Organic photovoltaic devices produced from conjugated polymer/methanofullerene bulk heterojunctions," Synthetic Metals, 121, pp. 1517–1520, Mar. 15, 2001.*

(List continued on next page.)

*Primary Examiner*—Alan Diamond
(74) *Attorney, Agent, or Firm*—Fish & Richardson P.C.

(57) ABSTRACT

A photovoltaic cell is described, having a photoactive layer (4) made of two molecular components, namely an electron donor and an electron acceptor, particularly a conjugated polymer component and a fullerene component, and having two metallic electrodes (2, 6) provided on both sides of the photoactive layer (4). In order to provide advantageous construction conditions, it is suggested that an intermediate layer (5) made of a conjugated polymer, which has doping corresponding to the electrode potential and, in regard to the electron energy, has a band gap between the valence band and the conduction band of at least 1.8 eV, be provided between the photoactive layer (4) and at least one electrode (2,6).

23 Claims, 1 Drawing Sheet

U.S. PATENT DOCUMENTS

| | | | |
|---|---|---|---|
| 5,221,854 A | | 6/1993 | Banerjee et al. |
| 5,247,190 A | | 9/1993 | Friend et al. |
| 5,331,183 A | | 7/1994 | Sariciftci et al. |
| 5,350,459 A | | 9/1994 | Suzuki et al. |
| 5,454,880 A | | 10/1995 | Sariciftci et al. |
| 5,470,910 A | | 11/1995 | Spanhel et al. |
| 5,670,791 A | | 9/1997 | Halls et al. |
| 5,677,572 A | | 10/1997 | Hung et al. |
| 5,698,048 A | * | 12/1997 | Friend et al. ............... 136/263 |
| 5,759,725 A | | 6/1998 | Hirao et al. |
| 5,986,206 A | | 11/1999 | Kambe et al. |
| 6,198,092 B1 | | 3/2001 | Bulovic et al. |
| 6,239,355 B1 | * | 5/2001 | Salafsky ..................... 136/250 |
| 6,291,763 B1 | | 9/2001 | Nakamura |
| 6,580,027 B2 | * | 6/2003 | Forrest et al. .............. 136/263 |
| 2002/0036298 A1 | | 3/2002 | Nelles et al. |
| 2002/0117201 A1 | | 8/2002 | Nelles et al. |
| 2003/0062082 A1 | | 4/2003 | Miteva et al. |
| 2003/0067000 A1 | | 4/2003 | Nelles et al. |
| 2004/0094196 A1 | * | 5/2004 | Shaheen et al. ............ 136/263 |

OTHER PUBLICATIONS

Roman et al, "High Quantum Efficiency Polythiophene/C60 Photodiodes," Adv. Mater. vol. 10, No. 10, pp. 774–777, (1998).*

Roman et al, "Multifunctional Polythiophenes in Photodiodes," Synthetic Metals, vol. 102, pp. 977–978, (1999).*

Pettersson et al, "Modeling Photocurrent Action Spectra of Photovoltaic Devices Based on Organic Thin Films," Journal of Applied Physics, vol. 86, No. 1, pp. 487–496, (Jul. 1, 1999).*

Brabec, C.J. et al. "Organic photovoltaic devices produced from conjugated polymer/methanofullerene bulk heterojunctions." Synthetic Metals, 121: pp1517–1520, 2001.

Conboy et al. "Impact of Solvent Vapor Annealing . . . " Journal of Physical Chemistry, 102:23, pp. 4516–4525, 1998.

Gao et al. "Efficient photodectors and . . . " International Conference on Science and Technology of Synthetic Metals, 85:1–3, pp. 979–980, 1997.

Kay, Andreas et al. "Low cost photovoltaic based on dye sensitized nanocrystalline titanium dioxide and carbon powder." Solar Energy Materials and Solar Cells, 44, pp. 99–117, 1996.

Papageorgious, N. et al. "Mediator Transport in Multilayer nanocrystalline Photoelectrochemical Cell Configurations." Journal of the Electrochemical Society, 146:3, pp. 898–907, 1999.

Quali et al. "Oligo (henylenevinylene)/Fullerene Photovoltaic Cells." Advanced Materials, VCH, 11:18, pp. 1515–1518, 1999.

Roman et al. "Photodiode Performance and . . . " Advanced Materials, 9:15, pp. 1164–1168, 1997.

Shaheen et al. "2.5% efficient organic plastic solar cells." Applied Physics Letters, 78:6, pp. 841–843, 2001.

Ser. No. 10/258,713, filed Oct. 25, 2002.

Ser. No. 10/258,708, filed Oct. 25, 2002.

Roman L S, et al (*1998*) "Multifunctional Polythiophenes in Photodiodes" Synthetic Metals, vol. 102, No. 1–3, p. 977–978.

Roman L S, et al (*1998*) "High Quantum Efficiency Polythiopene/C60 Photodiodes" Advanced Materials, vol. 10, No. 10, pp. 774–777.

Gao J et al (*1998*) "Polymer P–I–N Junction Photovoltaic Cells" Advanced Materials, vol. 10, No. 9, pp. 692–695.

Iizuka M et al (*1997*) "Optical and Electrical Properties of Multi–Layered Organic Cells" Molecular Crystals and Liquid Crystals, vol. 295, pp. 353–356.

Apperloo J J et al (*2000*) "Doping in Solution as an Order–Inducing Tool Prior to Film Formation of Regio–Irregular" Advanced Materials, vol. 12, No. 21, pp. 1594–1597.

Ho P K H et al (*1998*) Ultrathin Self–assembled Layers at the Ito Interface to Control Charge Injection and Electroluminescence Efficiency in Polymer Light–Emitting Diodes Advanced Materials, vol. 10, No. 10, pp. 769–774.

* cited by examiner

PHOTOVOLTAIC CELL

CROSS REFERENCE TO RELATED APPLICATIONS

Applicants claim priority under 35 U.S.C. §119 of Austrian Application No. A 735/2000, filed: Apr. 27, 2000. Applicants also claim priority under 35 U.S.C. §365 of PCT/AT01/00128, filed: Apr. 27, 2001. The international application under PCT article 21(2) was not published in English.

The present invention relates to a photovoltaic cell having a photoactive layer made of two components, namely an electron donor and an electron acceptor, particularly a conjugated polymer component and a fullerene component, and having two metallic electrodes provided on both sides of the photoactive layer.

Plastics having extensive π-electron systems, in which single and double bonds follow one another alternately in sequence, are referred to as conjugated plastics. These conjugated plastics have energy bands which are comparable with semiconductors in regard to electron energy, so that they may also be transferred from the non-conductive state into the metallically conductive state through doping. Examples of such conjugated plastics are polyphenylenes, polyvinylphenylenes (PPV), polythiophenes, or polyanilines. The efficiency of energy conversion of photovoltaic polymer cells made of a conjugated polymer is, however, typically between $10^{-3}$ and $10^{-2}\%$. To improve this efficiency, heterogeneous layers made of two conjugated polymer components have already been suggested (U.S. Pat. No. 5,670,791 A), one polymer component being used as an electron donor and the other polymer component as an electron acceptor. By using fullerenes, particularly buckminsterfullerenes $C_{60}$, as electron acceptors (U.S. Pat. No. 5,454,880 A), the charge carrier recombination otherwise typical in the photoactive layer may be largely avoided, which leads to a significant increase in efficiency. For reaching a good efficiency, good charge separation is a necessary, but not sufficient condition, because it must also be ensured that the separated charges also reach the corresponding electrodes of the photovoltaic cell. In typical photovoltaic cells of this type, a hole-collecting electrode made of indium/tin oxide (ITO) and an electrode-collecting electron made of aluminum have proven themselves.

The present invention is therefore based on the object of designing a photovoltaic cell of the type initially described in such a way that the charge transport between the photoactive layer and electrodes may be increased to elevate the short-circuit current.

The present invention achieves the object described in that an intermediate layer made of a conjugated polymer, which has a doping corresponding to the electrode potential and, in regard to the electron energy, has a band gap between the valence band and the conduction band of at least 1.8 eV, is provided between the photoactive layer and at least one electrode.

Since the conjugated polymer of the intermediate layer is doped according to the electrode potential, which means an oxidative doping in the region of the hole-collecting electrode and a reductive doping in the region of the electron-collecting electrode, the conjugated polymer ensures a hole excess in the region of the hole-collecting electrode, but an electron excess in the region of the electron-collecting electrode, so that, in the region of the oxidatively doped polymer, the hole conduction is reinforced, and the electron conduction is reinforced in the region of a reductively doped polymer. Since, however, the conjugated polymer of the respective intermediate layer has, in regard to the electron energy bands, a comparatively large band gap of at least 1.8 eV between the valence band and the conduction band, a correspondingly high activation energy results for the intrinsic conduction, which leads, in the case of an oxidatively doped polymer layer, to the electron conduction from the photoactive layer to the hole-collecting electrode being obstructed and, in the case of the reductively doped intermediate layer, to the hole conduction from the photoactive layer to the electron-collecting electrode being obstructed. With the aid of these separate intermediate layers, a valve effect may therefore be achieved, which supports the conduction of the charge carriers of the respective adjoining electrode which are to be collected from the photoactive layer to the electrode, but obstructs diffusion of opposing charges in the same direction. As a result of these separate layers, the charge conduction to the electrodes may correspondingly be improved, which directly results in an increase of the short-circuit current. It probably does not have to be emphasized that, depending on the application, photovoltaic cells may be used which have such an intermediate layer between the hole-collecting electrode and the photoactive layer, between the electron-collecting electrode and the photoactive layer, or in the region of both electrodes.

Although different conjugated polymers may be accordingly oxidatively or reductively doped to implement the intermediate layers, particularly advantageous ratios result if the intermediate layer is made of a doped polythiophene derivate. Both high polymers and oligomers are to be understood from the concept of polymer.

BRIEF DESCRIPTION OF THE DRAWINGS

An example of the object of the present invention is illustrated in the drawing.

As shown in FIG. 1, the photovoltaic cell comprises a transparent glass carrier 1, onto which an electrode layer 2 made of indium/tin oxide (ITO) is applied. This electrode layer 2 generally has a comparatively rough surface structure, so that it is covered with a smoothing layer 3 made of a polymer, typically PEDOT, which is made electrically conductive through doping. In contrast to typical photovoltaic cells of this type, according to the present invention, photoactive layer 4 is not applied directly onto the smoothing layer, but rather onto an intermediate layer 5, which is made of conjugated polymer, preferably from a poly(3-alkylthiophene), which is oxidatively doped using nitrosonium tetrafluoroborate after being applied onto smoothing layer 3, in order to obtain a corresponding hole excess.

Photoactive layer 4, which is applied onto intermediate layer 5 in the form of a solution, is made of a conjugated polymer, preferably a polythiophene derivate, as an electron donor, and a fullerene, particularly functionalized fullerene PCBM, as an electron acceptor. The concept of polymer is to be understood to mean both high polymers and oligomers. Electron-collecting electrode 6 is made of aluminum, which, in the case of the exemplary embodiment illustrated, is vapor deposited onto photoactive layer 4 without interposing a further intermediate layer, which would, however, be completely possible. In this case, the conjugated polymer of the intermediate layer would be reductively doped corresponding to the negative potential of electron-collecting electrode 6, in order to ensure a corresponding electron excess.

Figure 1:
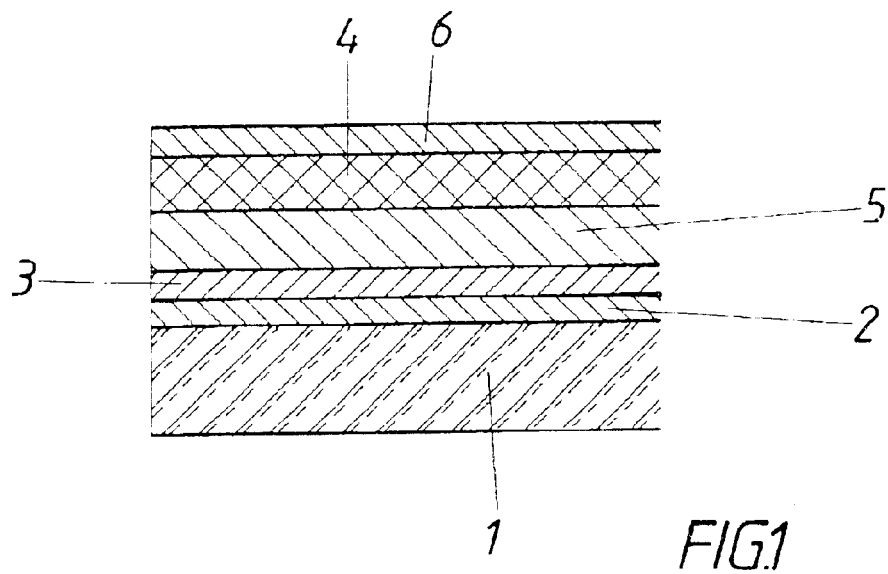
FIG. 1 shows a detail of a photovoltaic cell according to the present invention in a schematic section.
Figure 2:
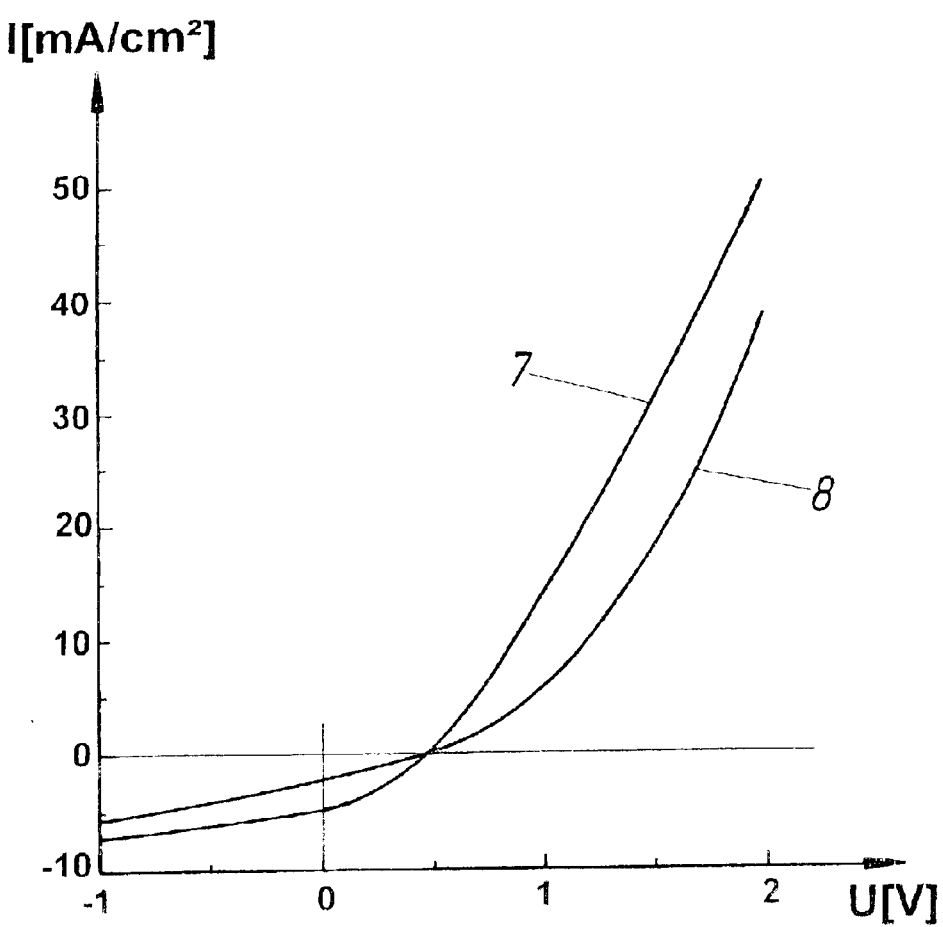
FIG. 2 shows the current-voltage characteristics of a typical photovoltaic cell and a photovoltaic cell according to the present invention.

Due to the intermediate layer 5, which has a band gap of at least 1.8 eV between the valence band and the conduction band, the entrance of electrons from photoactive layer 4 into intermediate layer 5 is made more difficult due to this comparatively broad band gap, without the hole conduction between photoactive layer 4 and hole-collecting electrode 2 being impaired. The conduction band of the conjugated polymer of intermediate layer 5 is, for example, in contrast to PEDOT layer 3, at a significantly higher energy level than the energy band of the electron acceptor of photoactive layer 4. This leads to a unipolar charge transfer from photoactive layer 4 to hole-collecting electrode 2, which is observable in a corresponding increase of the short-circuit current, as may be seen in FIG. 2. In FIG. 2, current density I is graphed over voltage U at an excitation energy of 80 mW/cm$^2$ under simulated AM 1.5 conditions for a photovoltaic cell according to the present invention in comparison to a cell constructed correspondingly, with the exception of intermediate layer 5. It is shown that characteristic 7, assigned to the photovoltaic cell according to the present invention, results in a short-circuit current, measured at voltage U=0 V, which is approximately twice as large as the short-circuit current of the comparison cell shown in characteristic 8.

It probably does not have to be noted in more detail that, if intermediate layer 5 is positioned between photoactive layer 4 and electron-collecting electrode 6, the distance of the valence bands, and not of the conduction bands, is decisive.

Since the effect of electrically insulating transition layer 6 is not restricted to conjugated polymers as electron donors and fullerenes as electron acceptors, the effect according to the present invention may also be observed in all photovoltaic cells having a molecular two-component layer made of an electron donor and an electron acceptor.

What is claimed is:

1. A photovoltaic cell, comprising:
   a first electrode;
   a second electrode;
   a first layer between the first and second electrodes, the first layer comprising:
     a first polymer, the first polymer being conjugated; and
     a fullerene component; and
   a second layer between the first electrode and the first layer, the second layer comprising doped poly(3-alkylthiophene).

2. The photovoltaic cell of claim 1, wherein the first polymer comprises a polythiophene derivative.

3. The photovoltaic cell of claim 2, wherein the fullerene component comprises functionalized fullerene PCBM.

4. The photovoltaic cell of claim 1, wherein the fullerene component comprises functionalized fullerene PCBM.

5. The photovoltaic cell of claim 1, wherein the doped poly(3-alkylthiophene) has a valence band, a conduction band and a band gap of at least about 1.8 eV between the valence band and the conduction band.

6. The photovoltaic cell of claim 1, further comprising a third layer between the first electrode and the second layer, the third layer comprising a third polymer.

7. The photovoltaic cell of claim 6, wherein the third polymer comprises PEDOT.

8. The photovoltaic cell of claim 1, wherein the first electrode comprises ITO and the second electrode comprises aluminum.

9. The photovoltaic cell of claim 2, wherein the doped poly(3-alkylthiophene) has a valence band, a conduction band, and a band gap of at least about 1.8 eV between the valence band and the conduction band.

10. The photovoltaic cell of claim 2, wherein the first electrode comprises ITO and the second electrode comprises aluminum.

11. A photovoltaic cell, comprising:
    a first electrode;
    a second electrode;
    a first layer between the first and second electrodes, the first layer comprising:
      a polythiophene derivative; and
      a fullerene component;
    a second layer between the first electrode and the first layer, the second layer comprising a doped polythiophene derivative; and
    a third layer between the first electrode and the second layer, the third layer comprising a third polymer.

12. The photovoltaic cell of claim 11, wherein the fullerene component comprises functionalized fullerene PCBM.

13. The photovoltaic cell of claim 11, wherein the doped polythiophene derivative comprises doped poly(3-alkylthiophene).

14. The photovoltaic cell of claim 13, wherein the doped poly(3-alkylthiophene) has a valence band, a conduction band, and a band gap of at least about 1.8 eV between the valence band and the conduction band.

15. The photovoltaic cell of claim 11, wherein the doped polythiophene derivative has a valence band, a conduction band and a band gap of at least about 1.8 eV between the valence band and the conduction band.

16. The photovoltaic cell of claim 11, wherein the third layer comprises PEDOT.

17. The photovoltaic cell of claim 11, wherein the first electrode comprises ITO and the second electrode comprises aluminum.

18. A photovoltaic cell, comprising:
    a first electrode;
    a second electrode;
    a first layer between the first and second electrodes, the first layer comprising:
      a first polymer, the first polymer being conjugated; and
      a fullerene component; and
    a second layer between the first electrode and the first layer, the second layer comprising a second polymer, the second polymer being a doped conjugated polymer; and
    a third layer between the first electrode and the second layer, the third layer comprising a third polymer.

19. The photovoltaic cell of claim 18, wherein the first polymer comprises a polythiophene derivative.

20. The photovoltaic cell of claim 18, wherein the fullerene component comprises functionalized fullerene PCBM.

21. The photovoltaic cell of claim 18, wherein the second polymer has a valence band, a conduction band, and a band gap of at least about 1.8 eV between the valence band and the conduction band.

22. The photovoltaic cell of claim 18, wherein the third polymer comprises PEDOT.

23. The photovoltaic cell of claim 18, wherein the first electrode comprises ITO and the second electrode comprises aluminum.

* * * * *